(12) United States Patent
Lee et al.

(10) Patent No.: US 12,495,496 B2
(45) Date of Patent: Dec. 9, 2025

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Youn Gyu Han, Suwon-si (KR); Chang Hwa Park, Suwon-si (KR); Yong Duk Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 183 days.

(21) Appl. No.: 18/104,526

(22) Filed: Feb. 1, 2023

(65) Prior Publication Data
US 2024/0049389 A1 Feb. 8, 2024

(30) Foreign Application Priority Data

Aug. 2, 2022 (KR) .......................... 10-2022-0096301

(51) Int. Cl.
*H05K 1/11* (2006.01)
*H01L 23/498* (2006.01)
(Continued)

(52) U.S. Cl.
CPC ........ *H05K 1/115* (2013.01); *H01L 23/49827* (2013.01); *H05K 1/0313* (2013.01);
(Continued)

(58) Field of Classification Search
CPC ........ H05K 1/115; H05K 1/0313; H05K 1/05; H05K 1/185; H05K 3/4644; H05K 3/4697; H05K 2201/10734; H05K 3/4682; H05K 3/4694; H05K 1/02; H05K 1/03; H05K 1/18; H05K 1/181; H05K 1/111; H05K 3/4655; H01L 23/49827; H01L 23/3121; H01L 25/50; H01L 21/6835; H01L 2221/68345; H01L 2221/68359; H01L 2224/1703; H01L 21/4857; H01L 24/17;
(Continued)

(56) References Cited

U.S. PATENT DOCUMENTS

| | | | |
|---|---|---|---|
| 4,628,406 A * | 12/1986 | Smith | H01L 23/5387 361/795 |
| 6,211,935 B1 * | 4/2001 | Yamada | H01L 23/544 257/E23.179 |

(Continued)

FOREIGN PATENT DOCUMENTS

KR 10-2163059 B1 10/2020

*Primary Examiner* — Ishwarbhai B Patel
(74) *Attorney, Agent, or Firm* — Morgan, Lewis & Bockius LLP

(57) ABSTRACT

A printed circuit board includes: a bridge including a first insulating material, a wiring pattern disposed in the first insulating layer, a metal post disposed on the first insulating material and connected to the wiring pattern, and a second insulating material disposed on the first insulating material and covering at least a portion of the metal post; a first build-up insulating material disposed around the bridge; and a first redistribution pattern disposed on the second insulating material and the first build-up insulating material and including a metal pad connected to the metal post.

26 Claims, 16 Drawing Sheets

(51) Int. Cl.
*H05K 1/03* (2006.01)
*H05K 1/05* (2006.01)
*H05K 1/14* (2006.01)
*H05K 1/18* (2006.01)
*H05K 3/46* (2006.01)

(52) U.S. Cl.
CPC ............... *H05K 1/05* (2013.01); *H05K 1/111* (2013.01); *H05K 1/142* (2013.01); *H05K 1/181* (2013.01); *H05K 1/185* (2013.01); *H05K 3/4644* (2013.01); *H05K 3/4697* (2013.01); *H05K 2201/10734* (2013.01)

(58) Field of Classification Search
CPC ............. H01L 25/0655; H01L 2224/81; H01L 23/5385
See application file for complete search history.

(56) References Cited

U.S. PATENT DOCUMENTS

| | | | |
|---|---|---|---|
| 2012/0309130 A1* | 12/2012 | Hin | H01L 21/568 257/E21.599 |
| 2013/0003314 A1* | 1/2013 | Igarashi | H01L 24/19 29/850 |
| 2013/0223033 A1* | 8/2013 | Mano | H05K 1/185 336/200 |
| 2020/0083179 A1 | 3/2020 | Lee et al. | |
| 2020/0303310 A1 | 9/2020 | Alur et al. | |
| 2021/0020574 A1 | 1/2021 | Yu et al. | |
| 2022/0151071 A1* | 5/2022 | Heo | H05K 1/115 |
| 2022/0157730 A1* | 5/2022 | Jang | H05K 3/4694 |

* cited by examiner

PRINTED CIRCUIT BOARD

CROSS-REFERENCE TO RELATED APPLICATION(S)

This application claims benefit of priority to Korean Patent Application No. 10-2022-0096301 filed on Aug. 2, 2022 in the Korean Intellectual Property Office, the disclosure of which is incorporated herein by reference in its entirety.

TECHNICAL FIELD

The present disclosure relates to a printed circuit board in which an electronic component, such as a semiconductor chip, may be embedded.

BACKGROUND

With a rapid increase in the number of central processing unit (CPU) and graphics processing unit (GPU) cores in server products, die-splitting technology, capable of effectively increasing the number of cores, has become commonplace. In addition, with increasing demand for a package including a high bandwidth memory (HBM), a technology for die-to-die connection with a fine circuit line width has been required. To satisfy such technical requirements, a technology using a silicon interposer, or the like, has been developed, but there is a limitation in commercialization thereof due to price issues and complicated assembly processes. In addition, technologies for embedding a silicon bridge in a substrate have been developed, but there is a limitation in implementing a high degree of alignment when a bridge is embedded, due to a bridge position tolerance, a via processing tolerance, a pad exposure tolerance, and/or the like.

SUMMARY

An aspect of the present disclosure is to provide a printed circuit board, capable of improving alignment when a bridge is embedded.

One of the solutions proposed by the present disclosure is to embed a bridge in a substrate after erecting a post and covering the post with an insulating material having high transparency.

According to an aspect of the present disclosure, a printed circuit board includes: a bridge including a first insulating material, a wiring pattern disposed in the first insulating layer, a metal post disposed on the first insulating material and connected to the wiring pattern, and a second insulating material disposed on the first insulating material and covering at least a portion of the metal post; a first build-up insulating material disposed around the bridge; and a first redistribution pattern disposed on the second insulating material and the first build-up insulating material and including a metal pad connected to the metal post. The second insulating material has transparency, higher than transparency of at least one of the first insulating material and the first build-up insulating material.

According to another aspect of the present disclosure, a printed circuit board includes: a bridge including a first insulating material, a wiring pattern disposed in the first insulating layer, a metal post disposed on the first insulating material and connected to the wiring pattern, and a second insulating material disposed on the first insulating material and covering at least a portion of the metal post; a first build-up insulating material covering at least a portion of the bridge; and a first redistribution pattern disposed on the second insulating material and the first build-up insulating material and including a metal pad connected to the metal post. An upper surface of the first build-up insulating material is provided with a groove portion exposing at least a portion of the second insulating material around the bridge.

According to another aspect of the present disclosure, a printed circuit board includes: a bridge including a first insulating material, a wiring pattern disposed in the first insulating layer, a metal post disposed on the first insulating material and connected to the wiring pattern, and a second insulating material disposed on the first insulating material and covering at least a portion of the metal post; a first build-up insulating material disposed around the bridge; and a first redistribution pattern disposed on the second insulating material and the first build-up insulating material and including a metal pad connected to the metal post. The first redistribution pattern is in contact with the first build-up insulating material, and among an upper surface and a side surface of the first insulating material, the second insulating material is disposed only on the first insulating material.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, exemplary embodiments of the present disclosure will be described in detail with reference to the accompanying drawings.

Electronic Device

Figure 1:
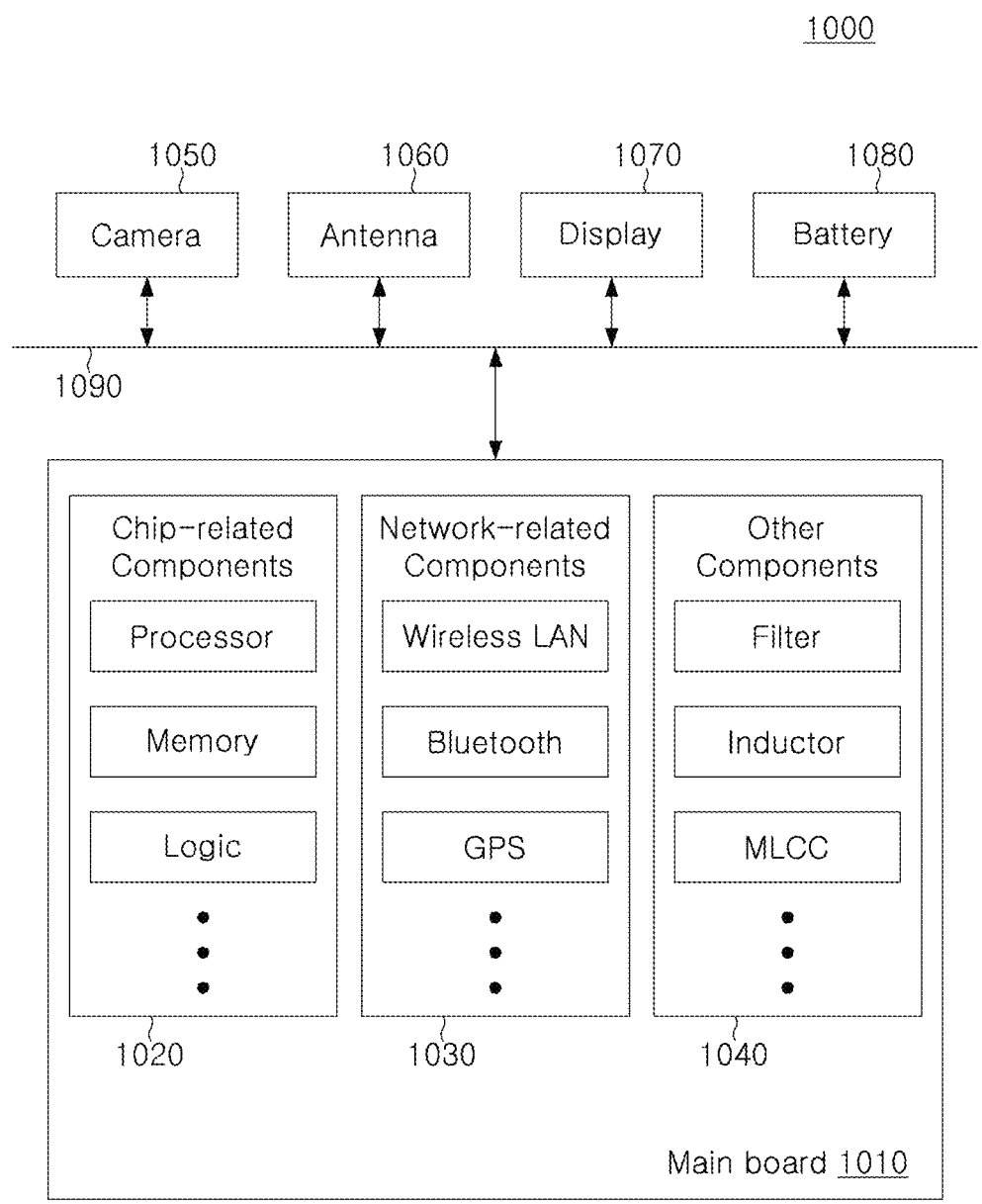
FIG. 1 is a schematic block illustrating an example of an electronic device system.

FIG. 1 is a schematic block diagram illustrating an example of an electronic device system.

Referring to FIG. 1, an electronic device 1000 may accommodate a mainboard 1010. The mainboard 1010 is physically and/or electrically connected to a chip-related component 1020, a network-related component 1030, other components 1040 or the like. These components may be also coupled to other components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter (ADC) or an application-specific integrated circuit (ASIC). The chip-related components 1020 are not limited thereto, but may also include other types of chip-related components. In addition, these chip-related components may be combined with each other. The chip-related components 1020 may be in the form of a package including the chips described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020.

The other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
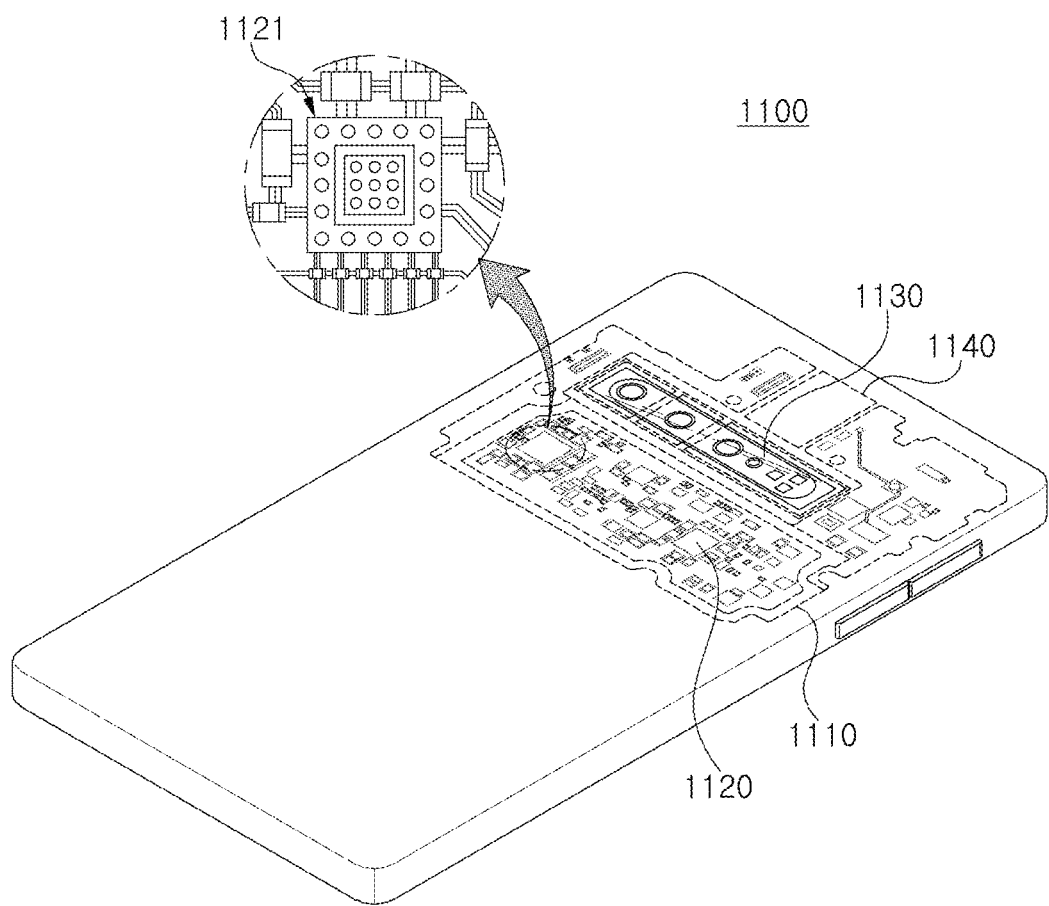
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, a camera module 1130, a speaker 1140, and/or the like may also be accommodated in the motherboard 1110. Some of the electronic components 1120 may be the above-described chip-related components, e.g., a printed circuit board 1121 with a plurality of electronic components mounted on a surface thereof, but are not limited thereto. Meanwhile, the electronic device is not necessarily limited to the smartphone 1100, but may be any other electronic device as described above.

Semiconductor Package Including Interposer

In general, scores of microelectronic circuits may be integrated in a semiconductor chip, but the semiconductor chip itself may not serve as a finished product of a semiconductor, and may be damaged by an external physical or chemical impact. Accordingly, the semiconductor chip itself may not be used as it is. For this reason, the semiconductor chip may be packaged and thus has been used for electronic devices, or the like, in a packaged state.

The semiconductor packaging is required because there is a difference in circuit widths between the semiconductor chip and the mainboard of the electronic device in terms of an electrical connection. For example, in the case of the semiconductor chip, a size of connection pads and an interval between the connection pads are significantly small. On the other hand, in the case of the mainboard used for the electronic device, a size of component mounting pads and an interval between the component mounting pads may be significantly larger than a scale of the semiconductor chip. Accordingly, there is a need for a packaging technology, capable of buffering the difference in the circuit widths between the semiconductor chip and the mainboard because it is difficult to directly mount the semiconductor chip on the mainboard.

Hereinafter, a semiconductor package including an organic interposer manufactured by such a packaging technique will be described in more detail with reference to the drawings.

Figure 3:
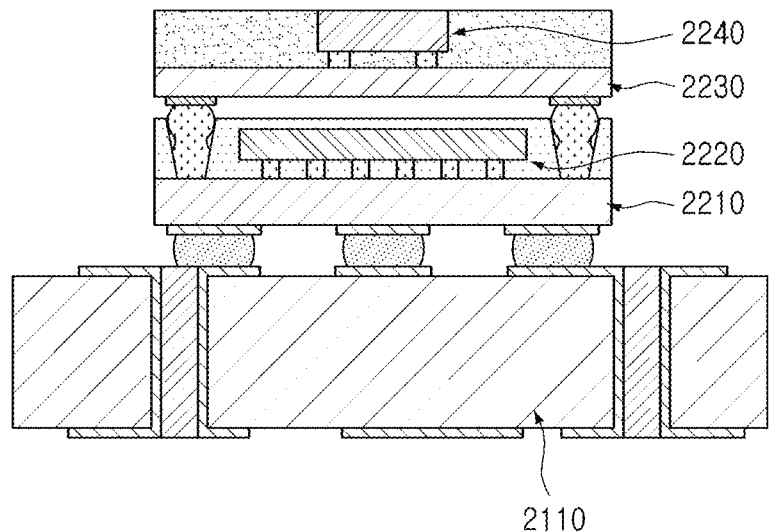
FIG. 3 is a schematic cross-sectional view illustrating a case in which a BGA package is mounted on a mainboard of an electronic device.

FIG. 3 is a schematic cross-sectional view illustrating a case in which a ball grid array (BGA) package is mounted on a mainboard of the electronic device.

It is significantly important to perform packaging at a high yield because each chip of an application specific integrated circuit (ASIC) such as a graphics processing unit (GPU) of a semiconductor chip is significantly expensive. For this purpose, a BGA substrate 2210, or the like, capable of redistributing thousands to hundreds of thousands of connection pads before mounting the semiconductor chip may be prepared, and then an expensive semiconductor chip such as a GPU 2220 may be mounted on the BGA substrate 2210 by a surface mounting technology (SMT) or the like and packaged, and finally mounted on a mainboard 2110. The BGA substrate 2210 may include a flip-chip BGA (FCBGA) substrate.

In the case of the GPU 2220, there is a need to significantly reduce a signal path to a memory such as a high bandwidth memory (HBM). To this end, the semiconductor chip such as an HBM 2240 may be mounted on the interposer 2230 and then packaged, and may be used by being stacked on the package on which the GPU 2220 is mounted in a package-on-package (POP) manner. However, in this case, a thickness of the device may be significantly increased, and it may be difficult to significantly reduce the signal path.

Figure 4:
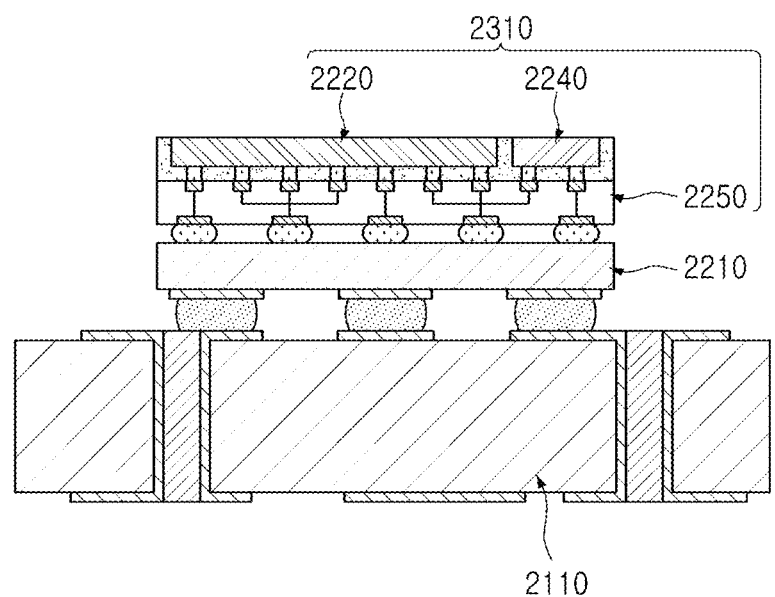
FIG. 4 is a schematic cross-sectional view illustrating a case in which a silicon interposer package is mounted on a mainboard.

FIG. 4 is a schematic cross-sectional view illustrating a case in which a silicon interposer package is mounted on a mainboard.

To address the above-described issues, a semiconductor package 2310 including a silicon interposer may be manufactured by an interposer technology of surface-mounting a first semiconductor chip such as a GPU 2220 and a second semiconductor chip such as an HBM 2240 on a silicon interposer 2250 side-by-side and then packaging the first semiconductor chip and the second semiconductor chip. In this case, the GPU 2220 and the HBM 2240 having thousands to hundreds of thousands of connection pads may be redistributed through the interposer 2250, and may be electrically connected by a minimum path. In addition, when the semiconductor package 2310 including such a silicon interposer is mounted on the BGA substrate 2210, or the like, again and distributed, the semiconductor package 2310 may finally be mounted on the mainboard 2110.

However, in the case of the silicon interposer 2250, it may be difficult to form a through-silicon via (TSV) and manufacturing costs may also be significantly high, which is disadvantageous for large-scale and low-cost manufacturing.

Figure 5:
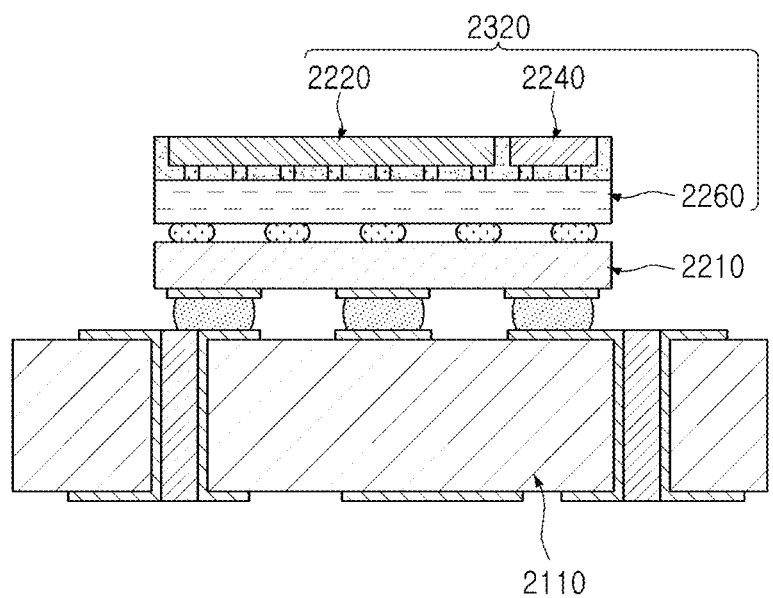
FIG. 5 is a schematic cross-sectional view illustrating a case in which an organic interposer package is mounted on a mainboard.

FIG. 5 is a schematic cross-sectional view illustrating a case in which an organic interposer package is mounted on a mainboard.

As a method for addressing the above-described issues, use of an organic interposer 2260, rather than the silicon interposer 2250, may be taken into consideration. For example, a semiconductor package 2320 including an organic interposer may be manufactured by an interposer technology of surface-mounting a first semiconductor chip such as the GPU 2220 and a second semiconductor chip such as the HBM 2240 on an organic interposer 2260 side-by-side and packaging the first semiconductor chip and the second semiconductor chip. In this case, the GPU 2220 and the HBM 2240 having thousands to hundreds of thousands of connection pads may be redistributed through the interposer 2260, and may be electrically connected by a minimum path. In addition, when the semiconductor package 2320 including such an organic interposer is mounted on the BGA substrate 2210, or the like, again and distributed, the semiconductor package 2310 may finally be mounted on the mainboard 2110. In addition, it is advantageous for large-scale and low-cost manufacturing.

However, in the case in which the organic interposer 2260 is used, the semiconductor chips 2220 and 2240 should be mounted on the organic interposer 2260, and then mounted again on the BGA substrate 2210. Therefore, a process may be somewhat complicated, and packaging yield may be reduced.

Printed Circuit Board in which Socket is Embedded

Figure 6:
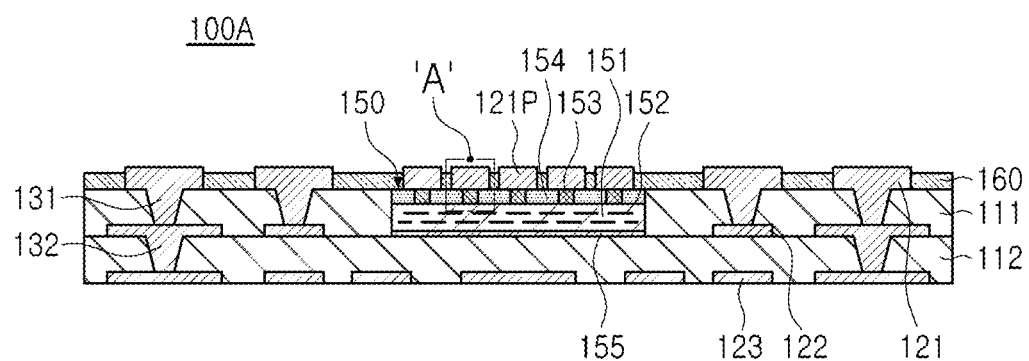
FIG. 6 is a schematic cross-sectional view illustrating an example of a printed circuit board.

FIG. 6 is a schematic cross-sectional view illustrating an example of a printed circuit board.

Figure 7A:
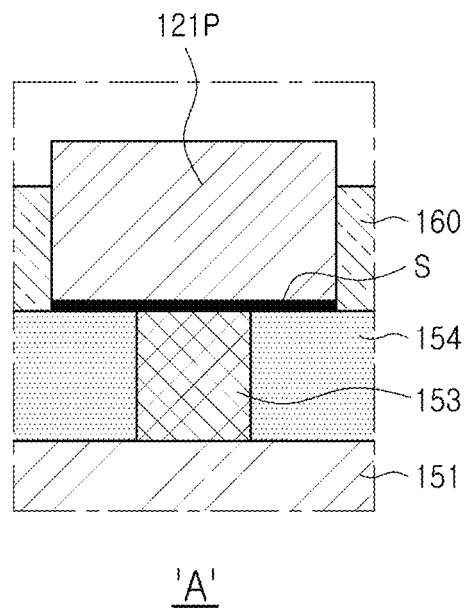
FIGS. 7A and 7B are schematic enlarged views of region "A" of the printed circuit board of FIG. 6.
Figure 7B:
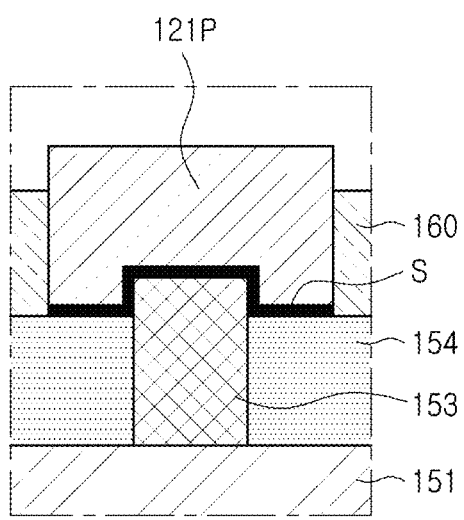

FIGS. 7A and 7B are schematic enlarged views of region "A" of the printed circuit board of FIG. 6.

Referring to the drawing, a printed circuit board 100A according to an example may include a bridge 150 including a first insulating material 151, a wiring pattern 152 disposed in the first insulating layer 151, a metal post 153 disposed on the first insulating material 151 and electrically connected to the wiring pattern 152, and a second insulating material 154 disposed on the first insulating material 151 and covering at least a portion of the metal post 153, a first build-up insulating material 111 disposed around the bridge 150 and contacting a side surface of the bridge 150, and a first redistribution pattern 121 disposed on the second insulating material 154 and the first build-up insulating material 111 and including a metal pad 121P electrically connected to the metal post 153, and the second insulating material 154 may have transparency, higher than transparency of the first insulating material 151 and/or the first build-up insulating material 111.

In the present disclosure, transparency may be measured using a scanning microscope or an optical microscope, for example an Olympus optical microscope (1000× magnification) after polishing or cutting the printed circuit board 100A to a depth, at which the bridge 150 is exposed, to obtain a cross-section. Alternatively, transparency may be determined by transmittance and haze values, and the transmittance and the haze may be measured using a UV-Vis Spectrometer (Lambda 1050, PerkinElmer). Transmittance may use a method of revealing constituents through component analysis and then recombining the constituents to obtain transmittance. In addition, transparency may be determined through reflectance.

As described above, the printed circuit board 100A according to an example may include the bridge 150 including a metal post 153 having a narrower width and a greater height than a general pad, so that a sufficient alignment tolerance may be secured. In addition, the metal post 153 may be covered with the second insulating material 154 to protect the metal post 153, and an effective thickness of the bridge 150 may be increased. For example, a side surface of the metal post 153 may be covered with the second insulating material 154. Furthermore, a planar surface may be provided when the bridge 150 is mounted. In addition, since the second insulating material 154 includes an insulating material having high transparency, alignment may be more easily recognized when the bridge 150 is mounted, so that precision of a mounting position may be improved, resulting in improved alignment when the bride is embedded. Accordingly, a process window may be widened to be advantageous for mass production. In addition, the degree of difficulty in manufacturing may be decreased.

As illustrated in FIG. 7A, an upper surface of the metal post 153 may be substantially coplanar with an upper surface of the second insulating material 154. In this case, a more planar surface may be provided. The term "substantially coplanar" refers to not only being fully coplanar, but also including some differences resulting from process errors. For example, in a process to be described later, the upper surface of the metal post 153 and the upper surface of the second insulating material 154 are substantially coplanar in a process of polishing the metal post 153 to be exposed after mounting the bridge 150. The metal pad 121P may be disposed on an upper surface of the second insulating material 154 to cover the exposed upper surface of the metal post 153. For example, the metal pad 121P and the metal post 153 may be directly connected to each other without processing a via, which may be more advantageous to improve alignment. A seed layer s of the metal post 153 may be continuously disposed on the upper surface of the second insulating material 154 and the upper surface of the metal post 153.

Alternatively, as illustrated in FIG. 7B, the upper surface of the metal post 153 may have a step difference with the upper surface of the second insulating material 154. For example, at least a portion of the metal post 153 may protrude upwardly of the upper surface of the second insulating material 154. In this case, a contact area with the metal pad 121P may be increased to have improved adhesion. The metal pad 121P may be disposed on the upper surface of the second insulating material 154 to cover the at least protruding portion of the metal post 153. For example, the metal pad 121P and the metal post 153 may be directly connected to each other without processing a via, so that it may be more advantageous to improve alignment. The seed layer s of the metal pad 121P may be continuously disposed on the upper surface of the second insulating material 154, side surfaces of the at least protruding portion of the metal posts 153, and upper surfaces of at least protruding portions of the metal posts 153.

The printed circuit board 100A may further include a resist 160 disposed on the bridge 150 and the first build-up insulating material 111 and covering at least a portion of the first redistribution pattern 121. An upper surface of the first redistribution pattern 121 may have a step difference with an upper surface of the resist 160. For example, the upper surface of the first redistribution pattern 121 may be disposed above the upper surface of the resist 160. For example, the resist 160 may have a thickness, lower than a thickness of the first redistribution pattern 121. In this case, a semiconductor chip may be more easily mounted.

In the present disclosure, a thickness may be measured using a scanning microscope or an optical microscope, for example, an Olympus optical microscope (1000× magnification), based on a polished or cut cross-section of the printed circuit board 100A.

The printed circuit board 100A may have an embedded trace substrate (ETS) structure. For example, the printed circuit board 100A may further include a second redistribution pattern 122 disposed in the first build-up insulating material 111 and electrically connected to the first redistribution pattern 121 through the first via 131, a second build-up insulating material 112 disposed on a lower side of the first build-up insulating material 111, and/or a third redistribution pattern 123 disposed in the second build-up insulating material 112 and electrically connected to the second redistribution pattern 122 through a second via 132. However, exemplary embodiments are not limited thereto, and the printed circuit board 100A may be a core-type substrate including a core insulating material. For example, a portion illustrated in the drawing may represent a built-up upper portion of the core-type substrate. The printed circuit board 100A may be a BGA substrate or an FCBGA substrate, but exemplary embodiments are not limited thereto.

Hereinafter, the components of the printed circuit board 100A according to an example will be described in more detail with reference to accompanying drawings.

Each of the first and second build-up insulating materials 111 and 112 may include an insulating material. An example of the insulating material may include a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, an Ajinomoto Build-up Film (ABF), prepreg, or the like. As a non-limiting example, the first and second build-up insulating materials 111 and 112 may include substantially the same insulating material, for example, an ABF, but exemplary embodiments are not limited thereto. Substantially the same insulating material may be the case in which insulating materials of the same brand name are used.

Each of the first to third redistribution patterns 121, 122, and 123 may include a metal material. An example of the metal material may include copper (Cu), aluminum (Al), silver (Ag), tin (Sn), gold (Au), nickel (Ni), lead (Pb), titanium (Ti), or alloys thereof. Each of the first and second redistribution patterns 121 and 122 may include an electroless plating layer (or chemical copper) and an electrolytic plating layer (or electrolytic copper), but exemplary embodiments are not limited thereto. As necessary, each of the first and second redistribution patterns 121 and 122 may further include a copper foil. The third redistribution pattern 123 may include only an electrolytic plating layer (or electrolytic copper) due to removal of a carrier copper foil used as a seed layer, but exemplary embodiments are not limited thereto.

Each of the first to third redistribution layers 121, 122, and 123 may perform various functions depending on a design of a corresponding layer. For example, each of the first to third redistribution layers 121, 122, and 123 may include a pattern for grounding, a pattern for power, a pattern for a signal, or the like. The pattern for a signal may include various signals, other than the pattern for grounding and the pattern for power, for example, a data signal. Each of the patterns may include a line pattern, a plane pattern, and/or a pad pattern. For example, the first redistribution pattern 121 may include a metal pad 121P. Since the metal pad 121P is also formed on the bridge 150 when the first redistribution pattern 121 is formed, alignment may be more improved.

Each of the first and second vias 131 and 132 may include a metal material. An example of the metal material may include copper (Cu), aluminum (Al), silver (Ag), tin (Sn), gold (Au), nickel (Ni), lead (Pb), titanium (Ti), or alloys thereof. The first and second vias 131 and 132 may be also formed when the first and second redistribution patterns 121 and 122, respectively. Accordingly, each of the first and second vias 131 and 132 may include an electroless plating layer (or chemical copper) and an electrolytic plating layer (or electrolytic copper), but exemplary embodiments are not limited thereto. Each of first and second vias 131 and 132 may be a filled-type via in which a via hole is filled with a metal material, but exemplary embodiments are not limited thereto. Alternatively, each of first and second vias 131 and 132 may be a conformal-type via in which a metal material is disposed along a wall surface of a via hole. Each of the via layers 131, 132, 133, and 134 may have a tapered shape in which a width of an upper surface is greater than a width of a lower surface in cross-section, and all of the via layers 131, 132, 133, and 134 may have shapes tapered in the same direction.

Each of the first and second vias 131 and 132 may perform various functions depending on a corresponding layer. For example, each of first and second vias 131 and 132 may include a via for grounding, a via for power, a via for a signal, or the like. The via for a signal may include a via for transmitting various signals, other than the via for grounding and the via for power, for example, a data signal.

The bridge 150 may be a silicon bridge manufactured by forming an insulating body of a silicon dioxide and forming a wiring through a deposition process, an organic bridge manufactured by forming an insulating body of an organic insulating material and forming a wiring through a plating process, or the like. The bridge 140 may be, in detail, an organic bridge. In this case, reliability issues caused by coefficient of thermal expansion (CTE) mismatching may rarely occur. In addition, process difficulty and costs for manufacturing the bridge 150 may be reduced. The bridge 150 may have an embedded trace substrate (ETS) structure. As described above, when the bridge 150 is formed in the form of a coreless substrate, a wiring may be designed with a fine pitch of a body. In addition, the bridge 150 may be manufactured at low cost and a process may be simplified, as compared with the silicon bridge. An example of the organic insulating material may include a photoimageable dielectric (PID) material, but exemplary embodiments are not limited thereto.

The first insulating material 151 may include an insulating material. The insulating material may be an organic insulating material such as a photoimageable dielectric (PID). When a photoimageable dielectric (PID) is used as a material of the first insulating material 151, a thickness of the first insulating material 151 may be significantly reduced and a photo-via hole may be formed. Thus, the wiring pattern 152 may be designed to have high density. However, the material is not limited thereto, and another organic insulating material such as an ABF may be used. In addition, the material may include an inorganic insulating material such as silicon. The first insulating material 151 may include a plurality of insulating layers, and the number of layers is not limited. Boundaries between the plurality of insulating layers may be distinct from each other, or may be unclear.

The wiring pattern 152 may provide a die-to-die interconnection path. The wiring pattern 152 may include a plurality of layers, and the number of layers is not limited. The wiring pattern 152 may perform various functions depending on a design of a corresponding layer, and may include at least a pattern for a signal. The pattern may include a line pattern and/or a pad pattern. The wiring pattern 152 and a via, connected thereto, may include a metal material such as copper (Cu), aluminum (Al), silver (Ag), tin (Sn), gold (Au), nickel (Ni), lead (Pb), titanium (Ti), or alloys thereof.

The wiring pattern 152 may have a circuit density, higher than a circuit density of the first to third redistribution patterns 121, 122, and 123. For example, the wiring pattern 152 may include a higher-density circuit. For example, an average pitch of the wirings included in the wiring pattern 152 may be smaller than an average pitch of the wirings included in the first to third redistribution patterns 121, 122, and 123. In addition, an average interlayer insulation distance between the wiring patterns 152 may be smaller than an average interlayer insulation distance between the first to third redistribution patterns 121, 122, and 123. The wiring patterns 152, formed in different layers, may be electrically connected to each other through a via formed in the first insulating material 151.

In the present disclosure, a pitch may be measured by capturing a cross-section of the printed circuit board 100A with a scanning microscope, an optical microscope, or the like, and an average pitch may be an average value of pitches between wirings measured at five arbitrary points. An interlayer insulation distance may also be measured by capturing a cross-section of the printed circuit board 100A with a scanning microscope, an optical microscope, or the like, and an average interlayer insulation distance may be an average value of insulation distances between adjacent wiring measured at five arbitrary points.

The metal post 153 may have a high aspect ratio. The metal post 153 may perform various functions, such as a post for a signal, a post for grounding, and a post for power, and may include at least a posit for a signal. The metal posts 153 may include a metal material such as copper (Cu), aluminum (Al), silver (Ag), tin (Sn), gold (Au), nickel (Ni), lead (Pb), titanium (Ti), or alloys thereof. The metal post 153 may be formed by a plating process, and may include an electroless plating layer (or chemical copper) and an electrolytic plating layer (or electrolytic copper), but exemplary embodiments are not limited thereto.

The second insulating material 154 may include an insulating material. An example of the insulating material may include a thermosetting resin such as an epoxy resin, a thermoplastic resin such as a polyimide resin, or a material in which the thermosetting resin and the thermoplastic resin are mixed with an inorganic filler such as silica, for example, an organic insulating material such as ABF, but exemplary embodiments are not limited thereto. When ABF is used as the material of the second insulating material 154, a special issue may not occur during a process because a material, similar to the material of the first and second build-up insulating materials 111 and 112, is included in the second insulating material 154. However, the second insulating material 154 may include an ABF having high transparency, among ABFs. For example, the second insulating material 154 may have transparency, higher than transparency of the first insulating material 151 and the first and second build-up insulating materials 111 and 112. As necessary, an upper surface of the second insulating material 154 may protrude further than an upper surface of the first build-up insulating material 111, but exemplary embodiments are not limited thereto.

The first and second insulating materials 151 and 154 may have boundaries separated from each other. In addition, the first and second insulating materials 151 and 154 may have boundaries separated from the first and second build-up insulating materials 111 and 112, respectively. In addition, the second insulating material 154 may have a boundary separated from the resist 160.

The bridge 150 may be attached to an upper surface of the second build-up insulating material 112 through an adhesive 155. The adhesive 155 may include an adhesive material known in the art, for example, an epoxy-based adhesive material, but the material is not limited thereto.

The resist 160 may be disposed on an outermost side of the printed circuit board 100A to protect the internal components. A material of the resist 160 is not particularly limited. For example, an insulating material may be used as the material of the resist 160. In this case, a solder resist may be used as the insulating material. However, exemplary embodiments are not limited thereto.

Figure 8:
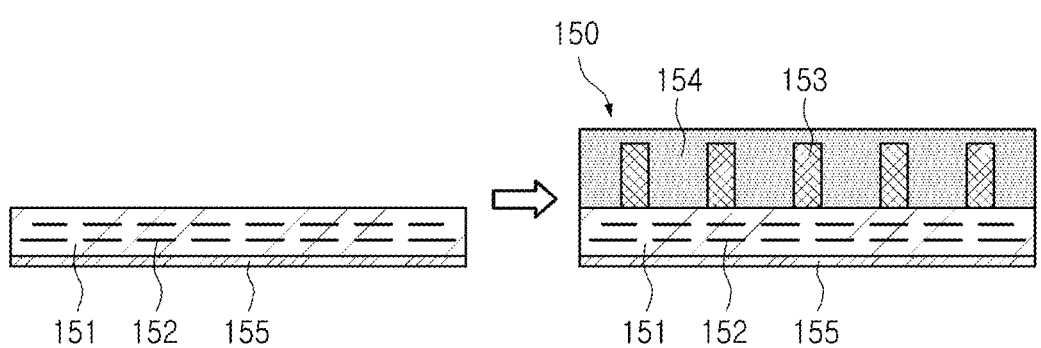
FIG. 8 is a schematic diagram illustrating an example of manufacturing a bridge embedded in the printed circuit board of FIG. 6.

FIG. 8 is a schematic diagram illustrating an example of manufacturing a bridge embedded in the printed circuit board of FIG. 6.

Referring to the drawing, a wiring pattern 152, or the like, may be formed on a first insulating material 151 using a semiconductor process, a substrate process, or the like. Then, a metal post 153 may be formed on the first insulating material 151 by a plating process using a resist, and a second insulating material 154 may be formed to cover the metal post 153. The bridge 150 may be in a state, in which the metal post 153 is embedded in the second insulating material 154 to not be exposed, before the printed circuit board 100A is embedded.

FIGS. 9A to 9G are schematic process diagrams illustrating an example of manufacturing the printed circuit board of FIG. 6.

Figure 9A:
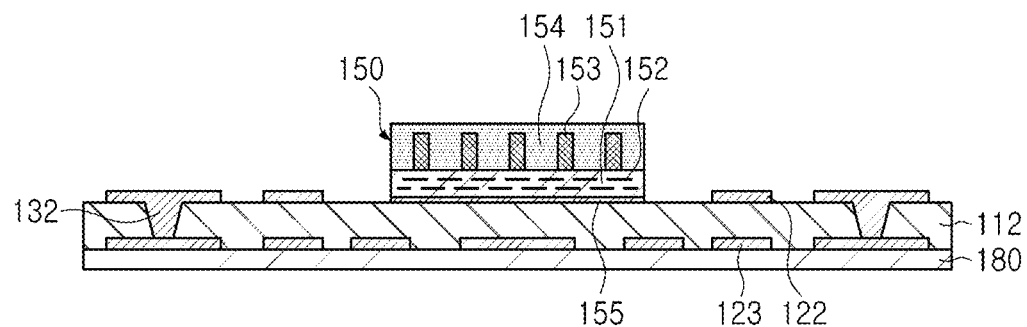
FIGS. 9A to 9G are schematic process diagrams illustrating an example of manufacturing the printed circuit board of FIG. 6.

Referring to FIG. 9A, a second build-up insulating material 112, second and third redistribution patterns 122 and 123, and a second via 132 may be formed on a carrier substrate 180 by a coreless process. The second and third redistribution patterns 122 and 123 and the second via 132 may be formed by a circuit formation process such as an additive process (AP), a semi-AP (SAP), a modified SAP (MSAP) tenting (TT), or the like. The second build-up insulating material 112 may be formed by an ABF lamination process, or the like. Then, the bridge 150 prepared in FIG. 8 is attached using an adhesive 155.

Figure 9B:
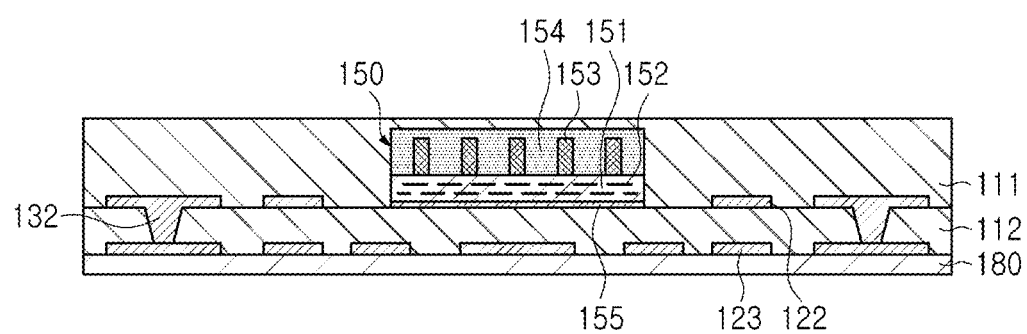

Referring to FIG. 9B, a first build-up insulating material 111 may be laminated on a second build-up insulating material 112 to embed the bridge 150. The first build-up insulating material 111 may be formed by, for example, laminating an ABF on the second build-up insulating material 112.

Figure 9C:
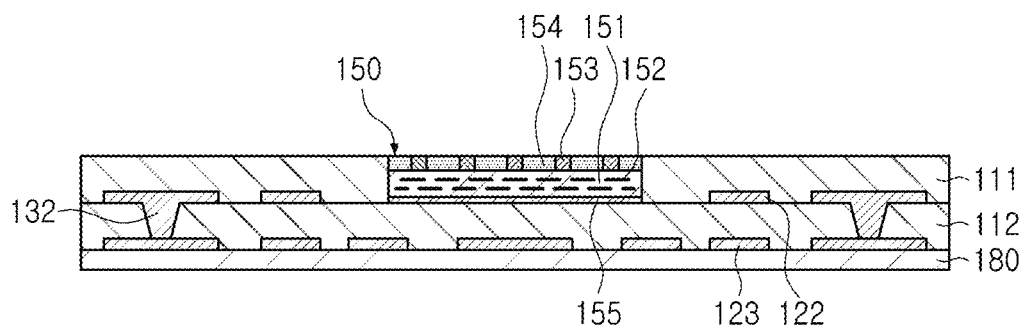

Referring to FIG. 9C, a metal post 153 may be exposed. An example of a method of exposing the metal posts 153 may include polishing such as chemical mechanical polishing (CMP), etching using plasma, desmearing, or the like. When CMP is used, the structure of FIG. 7A may be more easily formed. When etching using plasma is used, the structure of FIG. 7B may be more easily formed.

Figure 9D:
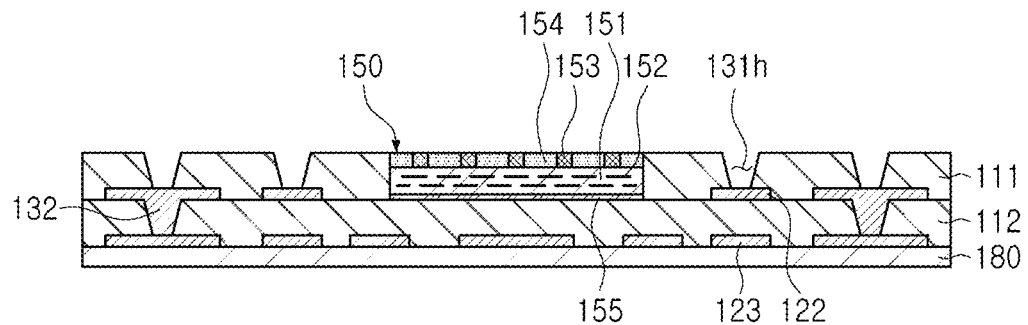

Referring to FIG. 9D, a via hole 131h may be formed in the first build-up insulating material 111. The via hole 131h may be formed using laser processing, mechanical drilling, or the like.

Figure 9E:
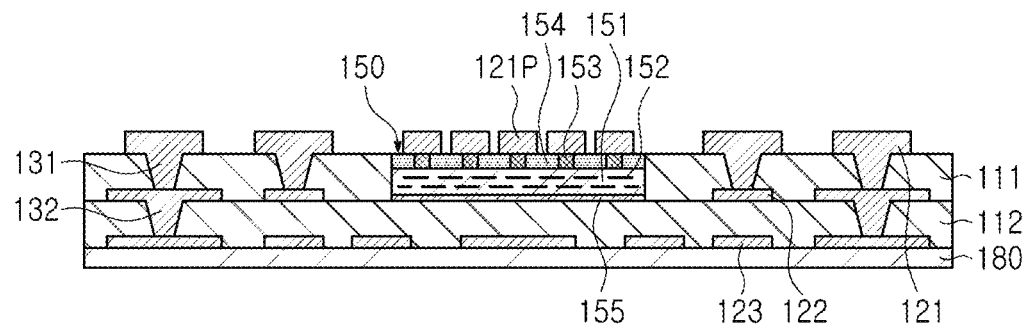

Referring to FIG. 9E, a first redistribution pattern 121 may be formed on the second insulating material 154 and the first build-up insulating material 111 and a first via 131 may be formed in the via hole 131h of the first build-up insulating material 111. The first redistribution pattern 121 and the first via 131 may be formed using a circuit formation process such as AP, SAP, MSAP, or TT. The metal pad 121P of the first redistribution pattern 121 may be connected to the exposed metal post 153.

Figure 9F:
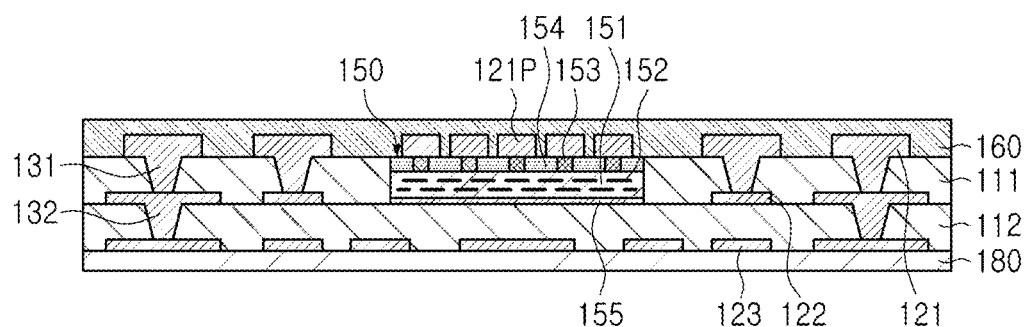

Referring to FIG. 9F, a resist 160 may formed on the bridge 150 and the first build-up insulating material 111. The resist 160 may be formed by coating and curing a solder resist material. Alternatively, the resist 160 may be formed by laminating a film-type material.

Figure 9G:
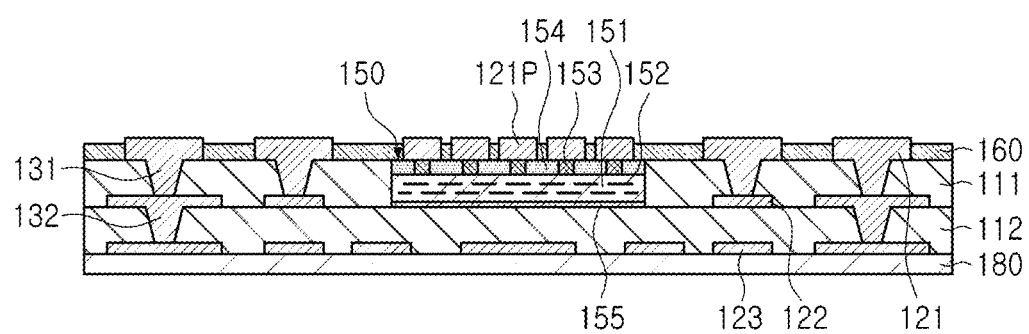

Referring to FIG. 9G, the resist 160 may be thinned. A thickness of the resist 160 may be reduced by a thinning process. As the thinning process, various methods such as a chemical treatment using an etchant or a mechanical treatment using polishing may be used.

The above-described printed circuit board 100A according to an example may be manufactured through a series of processes. Then, the manufactured printed circuit board 100A may be separated from the carrier substrate 180. For example, a carrier copper foil portion may be separated from the carrier substrate 180, and a carrier copper foil may then be removed by etching, but exemplary embodiments are not limited thereto.

Figure 10:
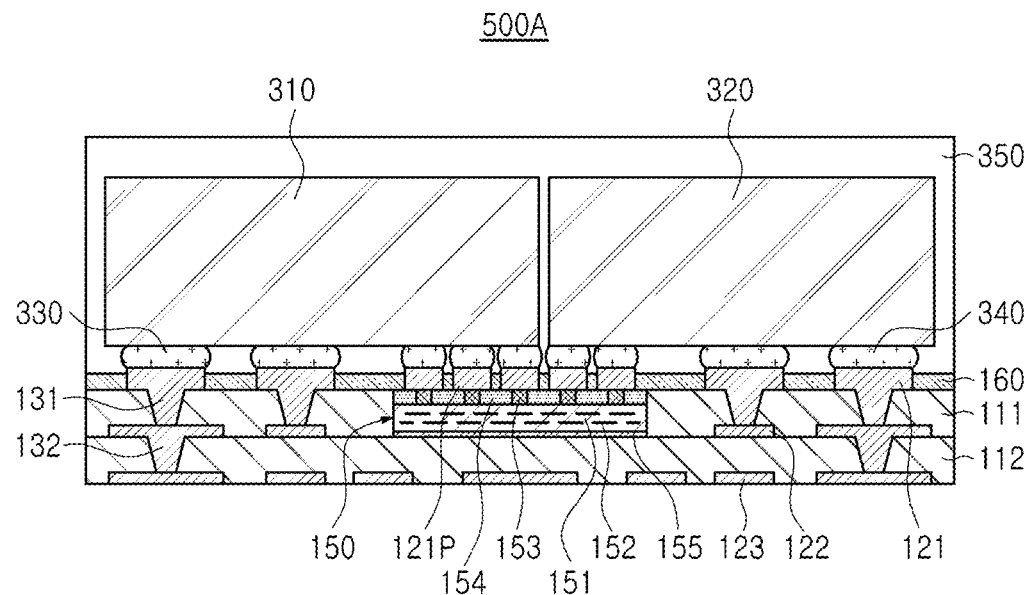
FIG. 10 is a schematic cross-sectional view illustrating an example of a semiconductor package.

FIG. 10 is a schematic cross-sectional view illustrating an example of a semiconductor package.

Referring to the drawing, a semiconductor package 500A according to an example may include a printed circuit board 100A according to an example and a plurality of semiconductor chips 310 and 320, respectively mounted on the printed circuit board 100A. The plurality of semiconductor chips 310 and 320 may be mounted on the printed circuit board 100A through a plurality of bumps 330 and 340, respectively. For example, the plurality of semiconductor chips 310 and 320 may be connected to a first redistribution pattern 121 through the plurality of bumps 330 and 340, respectively. Each of the plurality of semiconductor chips 310 and 320 may be covered with a molding material 350.

Each of the plurality of semiconductor chips 310 and 320 may be an integrated circuit (IC) die in which hundreds to millions of devices are integrated in a single chip. The integrated circuit may be, for example, a processor chip such as a central processor (for example, a CPU), a graphics processor (for example, a GPU), a field programmable gate array (FPGA), a digital signal processor, a cryptographic processor, a microprocessor, or a microcontroller, an application processor (for example, an AP), a logic chip such as an analog-to-digital converter or an application-specific IC (ASIC), or the like, but exemplary embodiments are not limited thereto. Each of the plurality of semiconductor chips 310 and 320 may be a memory chip such as a volatile memory (for example, a dynamic random access memory (DRAM)), a nonvolatile memory (for example, a read-only memory (ROM)), a flash memory, a high bandwidth memory (HBM), or the like, or another type of chip such as a power management IC (PMIC). For example, the first semiconductor chip 310 may include a logic chip such as a GPU, and the second semiconductor chip 320 may include a memory chip such as an HBM. The first and second semiconductor chips 310 and 320 may be split logic chips split by die split to have different cores.

Each of the plurality of semiconductor chips 310 and 320 may be formed based on an active wafer. In this case, silicon (Si), germanium (Ge), gallium-arsenide (GaAs), or the like, may be used as a base material forming a body of each of the semiconductor chips 310 and 320. Various circuits may be formed in the body. A connection pad may be formed on the body, and the connection pad may include a conductive material such as aluminum (Al) or copper (Cu). Each of the plurality of semiconductor chips 310 and 320 may be a bare die. In this case, a metal bump may be disposed on the pad. Each of the plurality of semiconductor chips 310 and 320 may be a packaged die. In this case, an additional redistribution layer may be formed on a pad, and a metal bump may be disposed on the redistribution layer.

Each of the plurality of bumps 330 and 340 may be formed of a low-melting-point metal, for example, a solder such as tin-aluminum-copper (Sn—Al—Cu), or the like. However, this is only an example and the material is not limited. Each of the plurality of bumps 330 and 340 may be formed to have a multilayer structure or a single-layer structure. When each of the plurality of bumps 330 and 340 is formed to have a multilayer structure, each of the plurality of bumps 330 and 340 may include a copper pillar and a solder. When each of the plurality of bumps 330 and 340 is formed to have a single-layer structure, each of the plurality of bumps 330 and 340 may include a tin-silver solder or copper, but exemplary embodiments are not limited thereto.

The molding material 350 may protect the plurality of semiconductor chips 310 and 320. A material of the molding material 350 is not limited, and a molding material known in the art, such as an epoxy molding compound (EMC), may be used.

Other descriptions, for example, the descriptions provided in the above-described printed circuit board 100A according to an example, which do not conflict with the following description, may be applied thereto, and thus, overlapping descriptions will be omitted.

Figure 11:
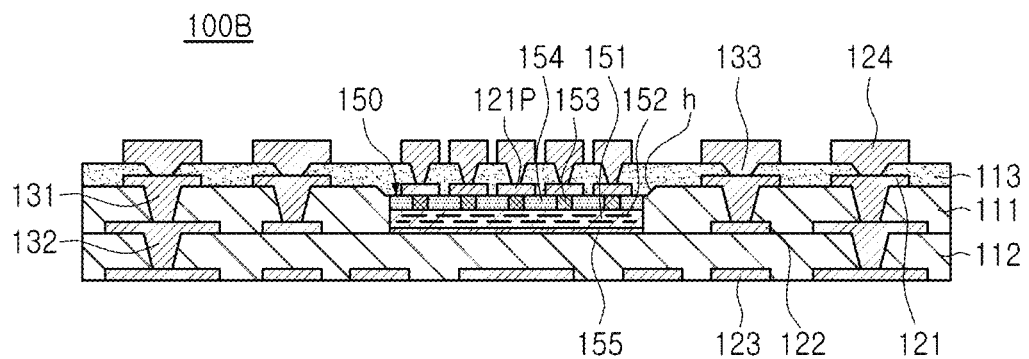
FIG. 11 is a schematic cross-sectional view illustrating another example of a printed circuit board.

FIG. 11 is a schematic cross-sectional view illustrating another example of a printed circuit board.

Referring to the drawing, in a printed circuit board 100B according to another example, a third build-up insulating material 113 may be further formed on the bridge 150 and the first build-up insulating material 111 in the above-described printed circuit board 100A according to an example. A fourth redistribution pattern 124 may be further formed on the third build-up insulating material 113. A third via 133, electrically connecting the first and fourth redistribution patterns 121 and 124 to the third build-up insulating material 113, may be further formed. In addition, an upper surface of the first build-up insulating material 111 may be provided with a groove portion h around the bridge 150, and an upper surface of the first build-up insulation material 111 may have a step difference caused by the groove portion h. The groove portion h may expose at least a portion of the second insulating material 154. The groove portion h may have a tapered wall surface, but exemplary embodiments are not limited thereto. As necessary, a resist may be further formed on the third build-up insulating material 113 to cover at least a portion of the fourth redistribution pattern 124, and a thickness of the resist may be reduced by a thinning process.

The third build-up insulating material 113 may include an insulating material. An example of the insulating material may include a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, an ABF, prepreg, or the like. As a non-limiting example, the first to third build-up insulating materials 111, 112, and 113 may include substantially the same insulating material, for example, an ABF, but exemplary embodiments are not limited thereto. Substantially the same insulating material may be the case in which insulating materials of the same brand name are used.

The fourth redistribution pattern 124 may include a metal material. An example of the metal material may include copper (Cu), aluminum (Al), silver (Ag), tin (Sn), gold (Au), nickel (Ni), lead (Pb), titanium (Ti), or alloys thereof. The fourth redistribution pattern 124 may include an electroless plating layer (or chemical copper) and an electrolytic plating layer (or electrolytic copper), but exemplary embodiments are not limited thereto. As necessary, the fourth redistribution pattern 124 may further include a copper foil.

The fourth redistribution pattern 124 may perform various functions depending on a design of a corresponding layer. For example, the fourth redistribution pattern 124 may include a pattern for grounding, a pattern for power, a pattern for a signal, or the like. The pattern for a signal may include various signals, other than the pattern for grounding and the pattern for power, for example, a data signal. Each of the patterns may include a line pattern, a plane pattern, and/or a pad pattern.

The third via 133 may include a metal material. An example of the metal material may include copper (Cu), aluminum (Al), silver (Ag), tin (Sn), gold (Au), nickel (Ni), lead (Pb), titanium (Ti), or alloys thereof. The third via 133 may include an electroless plating layer (or chemical copper) and an electrolytic plating layer (or electrolytic copper), but exemplary embodiments are not limited thereto. The third via 133 may be a filled-type via in which a via hole is filled with a metal material, but exemplary embodiments are not limited thereto. Alternatively, the third via 133 may be a conformal-type via in which a metal material is disposed along a wall surface of a via hole. The third via 133 may have a tapered shape in which a width of an upper surface is greater than a width of a lower surface in cross-section, and may have shapes tapered in the same direction.

The third via 133 may perform various functions depending on a corresponding layer. For example, the third via 133 may include a via for grounding, a via for power, a via for a signal, or the like. Here, the via for a signal may include a via for transmitting various signals, other than the via for grounding and the via for power, for example, a data signal.

As necessary, a resist may be further disposed on the third build-up insulating material 113. The description of the resist 160 of the printed circuit board 100A may be substantially equivalently applied to a detailed description of the resist.

Other descriptions, for example, the descriptions provided in the above-described printed circuit board 100A according to an example, which do not conflict with the following description, may be applied to the printed circuit board 100B, and thus, overlapping descriptions will be omitted.

FIGS. 12A to 12E are schematic process diagrams illustrating an example of manufacturing the printed circuit board of FIG. 11.

The second build-up insulating material 112, the second and third redistribution patterns 122 and 123, and the second via 132 may be formed on the carrier substrate 180 by a coreless process. Then, the first build-up insulating material 111 may be laminated on the second build-up insulating material 112 to embed the bridge 150. A detailed description thereof is substantially the same as the description provided with reference to FIGS. 9A and 9B.

Figure 12A:
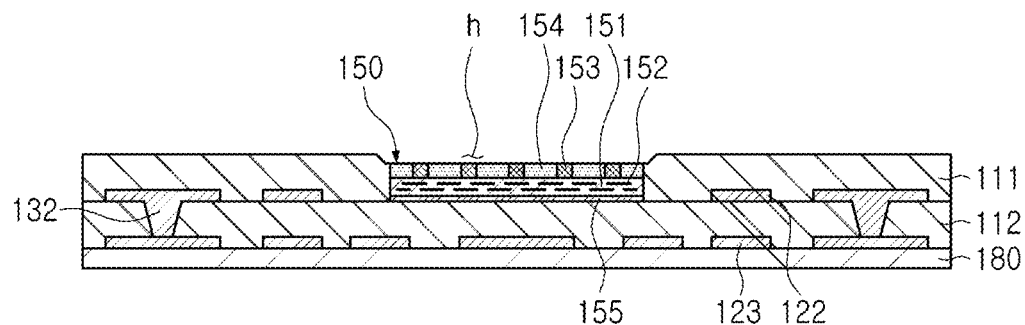
FIGS. 12A to 12E are schematic process diagrams illustrating an example of manufacturing the printed circuit board of FIG. 11.

Referring to FIG. 12A, the metal post 153 may be exposed. A local skiving process or a local thinning process may be used as a process of exposing the metal posts 153. A groove portion h may be formed around the bridge 150 on an upper surface of the first build-up insulating material 111 by such a partial exposure process. In addition, a step difference may be formed on the upper surface of the first build-up insulating material 111. However, exemplary embodiments are not limited thereto, and even when a method such as plasma, blasting, or etching is used, the above-mentioned groove portion h and a step difference caused by the groove portion h may be formed due to a difference in physical properties of the insulating material or a difference in the amount of accumulated curing.

Figure 12B:
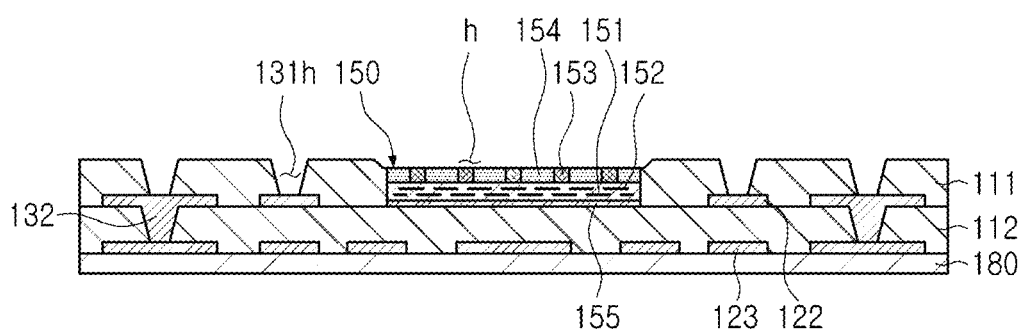

Referring to FIG. 12B, a via hole 131h may be formed in the first build-up insulating material 111. The via hole 131h may be formed using laser processing, mechanical drilling, or the like.

Figure 12C:
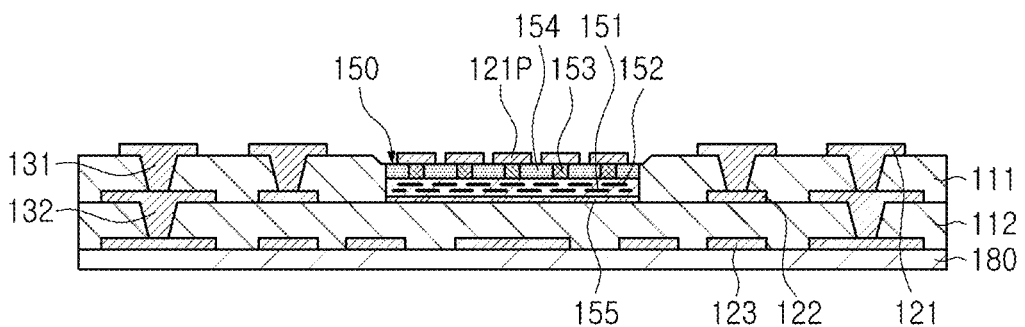

Referring to FIG. 12C, the first redistribution pattern 121 may be formed on the second insulating material 154 and the first build-up insulating material 111. The first redistribution pattern 121 may be formed using a circuit formation process such as AP, SAP, MSAP, or TT. The metal pad 121P of the first redistribution pattern 121 may be connected to the exposed metal post 153. In this process, the metal pad 121P of the first redistribution patterns 121 may have a step difference with remaining patterns thereof.

Figure 12D:
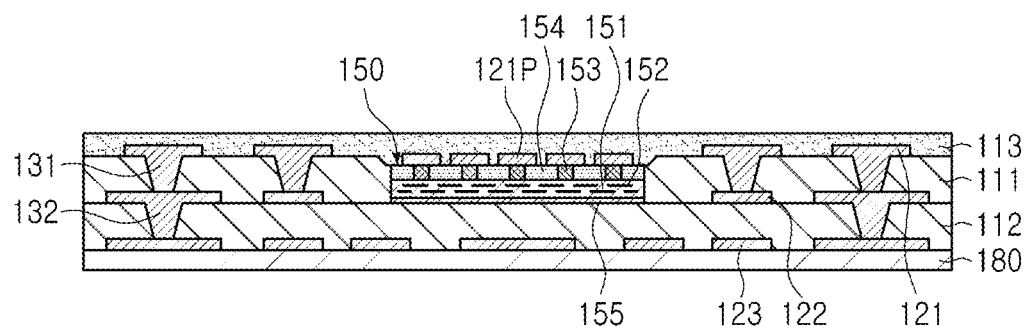

Referring to FIG. 12D, the third build-up insulating material 113 may be formed on the bridge 150 and the first build-up insulating material 111, which may compensate for the step difference of the first redistribution pattern 121. The third build-up insulating material 113 may be formed by, for example, laminating an ABF on the bridge 150 and the first build-up insulating material 111.

Figure 12E:
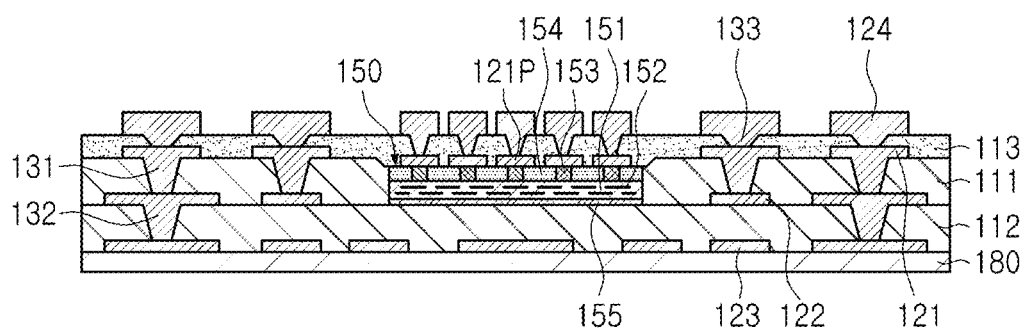

Referring to FIG. 12E, a fourth redistribution pattern 124 and a third via 133 may be formed. The fourth redistribution pattern 124 and the third via 133 may be formed using a circuit formation process such as AP, SAP, MSAP, or TT after processing a via hole in the third build-up insulating material 113.

The above-described printed circuit board 100B according to another example may be manufactured through a series of processes. As necessary, a resist may be further formed on the third build-up insulating material 113, and a resist thinning process may be performed. Then, the manufactured printed circuit board 100B may be separated from the carrier substrate 180. For example, the carrier copper foil portion may be separated from the carrier substrate 180, and the carrier copper foil may then be removed by etching, but exemplary embodiments are not limited thereto.

Figure 13:
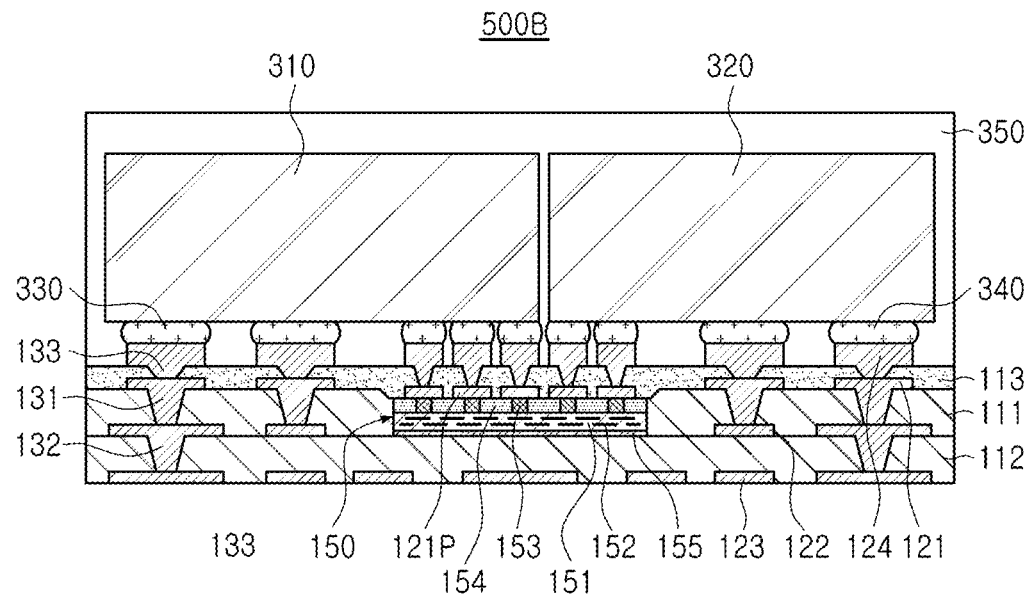
FIG. 13 is a schematic cross-sectional view illustrating another example of a semiconductor package.

FIG. 13 is a schematic cross-sectional view illustrating another example of a semiconductor package.

Referring to the drawing, a semiconductor package 500B according to another example may include a printed circuit board 100B and a plurality of semiconductor chips 310 and 320, respectively mounted on the printed circuit board 100B. The plurality of semiconductor chips 310 and 320 may be mounted on the printed circuit board 100B through a plurality of bumps 330 and 340, respectively. For example, the plurality of semiconductor chips 310 and 320 may be connected to a fourth redistribution pattern 124 through the plurality of bumps 330 and 340, respectively. Each of the plurality of semiconductor chips 310 and 320 may be covered with a molding material 350.

Other descriptions, for example, the descriptions provided in the above-described printed circuit board 100A according to an example, the above-described printed circuit board 100B according to another example, and the above-described semiconductor package 500A according to an example, which do not conflict with the following description, may be applied to the semiconductor package 500B, and thus, overlapping descriptions will be omitted.

Figure 14:
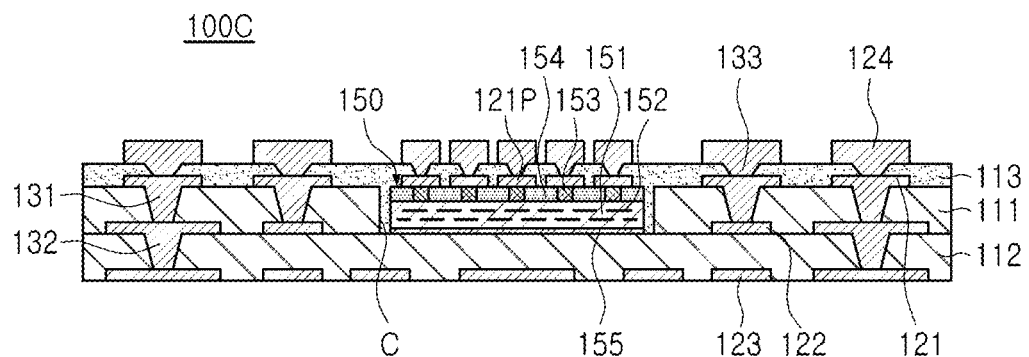
FIG. 14 is a schematic cross-sectional view illustrating another example of a printed circuit board.

FIG. 14 is a schematic cross-sectional view illustrating another example of a printed circuit board.

Referring to the drawing, in the printed circuit board 100C according to another example, the first build-up insulating material 111 may have a cavity C in the above-described printed circuit board 100B according to another example, and the bridge 150 may be disposed in the cavity C. In addition, the third build-up insulating material 113 may fill at least a portion of the cavity C. As necessary, a resist may be further formed on the third build-up insulating material 113 to cover at least a portion of the fourth redistribution pattern 124, and a thickness of the resist may be reduced by a thinning process.

The cavity C may be formed such that a wall surface continuously surrounds a side surface of the bridge 150, but exemplary embodiments are not limited thereto. As necessary, a stopper layer may be disposed on a bottom surface of the cavity C.

As necessary, a resist may be further disposed on the third build-up insulating material 113, and a detailed description thereof may be substantially the same as the description of the resist 160 of the printed circuit board 100A according to an example.

Other descriptions, for example, the descriptions provided in the above-described printed circuit board 100A according to an example and the above-described printed circuit board 100B according to another example, which do not conflict with the following description, may be applied to the printed circuit board 100C, and thus, overlapping descriptions will be omitted.

FIGS. 15A to 15E are schematic process diagrams illustrating an example of manufacturing the printed circuit board of FIG. 14.

The second build-up insulating material 112, the second and third redistribution patterns 122 and 123, and the second via 132 may be formed on the carrier substrate 180 by a coreless process. A detailed description thereof may be substantially the same as the description provided with reference to FIG. 9A. Then, the first build-up insulating material 111 may be formed on the second build-up insulating material 112. The first build-up insulating material 111 may be formed by ABF lamination, or the like.

Figure 15A:
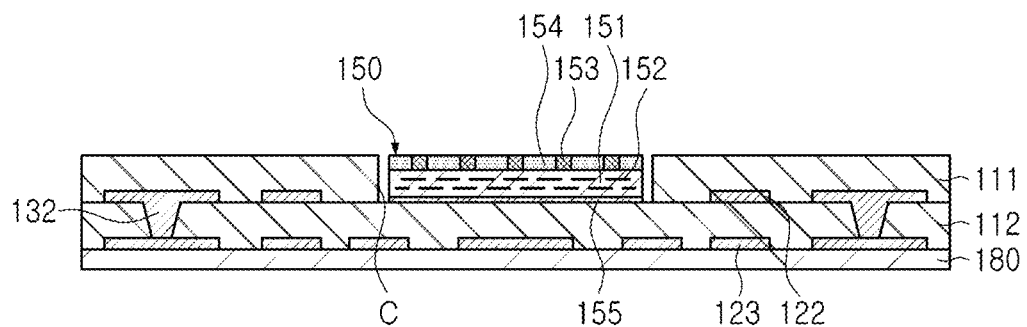
FIGS. 15A to 15E are schematic process diagrams illustrating an example of manufacturing the printed circuit board of FIG. 14.

Referring to FIG. 15A, a cavity C may be formed in the first build-up insulating material 111. The cavity C may be formed by various methods. For example, the cavity C may be formed by forming a dummy pattern in a processing region of the cavity C, laminating the first build-up insulating material 111, and removing the dummy pattern by etching. Alternatively, the cavity C may be formed by forming the first build-up insulating material 111 and the performing blast processing, laser processing, or the like. In this case, a stopper layer may be disposed on a bottom surface of the cavity C. The cavity C may be formed by various other methods. Then, the bridge 150 may be disposed in the cavity C, and the metal post 153 may be exposed by a process such as a polishing process, a thinning process, an etching process, or the like.

Figure 15B:
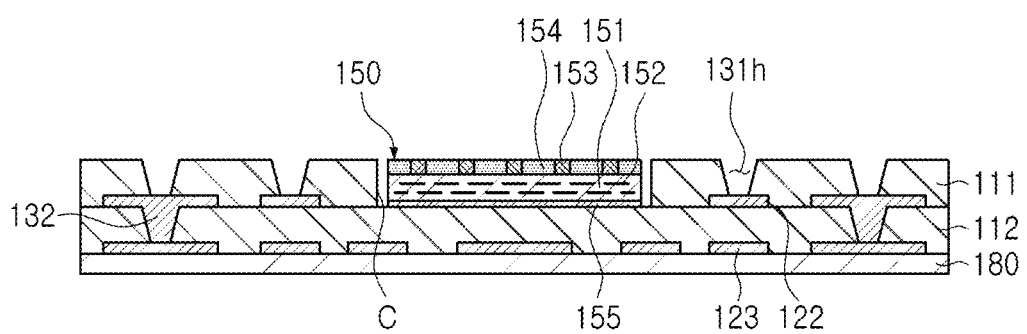

Referring to FIG. 15B, a via hole 131h may be formed in the first build-up insulating material 111. The via hole 131h may be formed using laser processing, mechanical drilling, or the like.

Figure 15C:
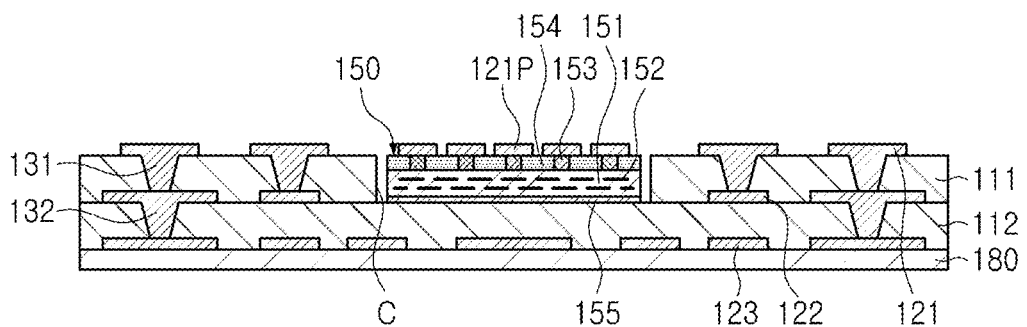

Referring to FIG. 15C, a first redistribution pattern 121 may be formed on the second insulating material 154 and the first build-up insulating material 111. The first redistribution pattern 121 may be formed using a circuit formation process such as AP, SAP, MSAP, or TT. A metal pad 121P of the first redistribution pattern 121 may be connected to the exposed metal post 153. In this process, the metal pad 121P of the first redistribution patterns 121 may have a step difference with remaining patterns.

Figure 15D:
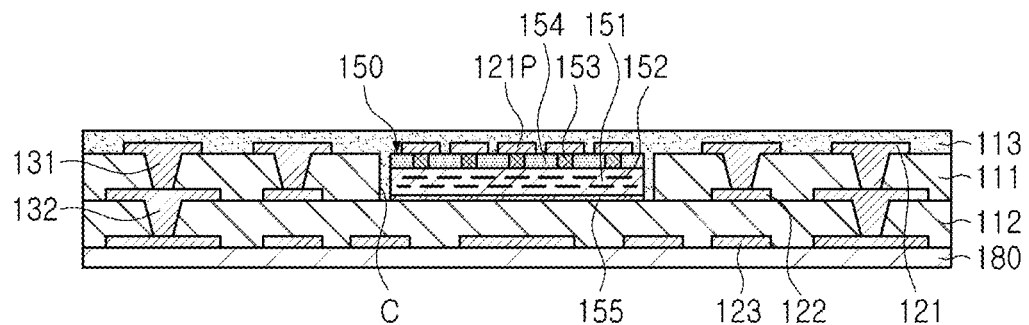

Referring to FIG. 15D, a third build-up insulating material 113 may be formed on the bridge 150 and the first build-up insulating material 111, which may compensate for the step difference of the first redistribution pattern 121, and may fill the cavity C. The third build-up insulating material 113 may be formed by, for example, laminating an ABF on the bridge 150 and the first build-up insulating material 111.

Figure 15E:
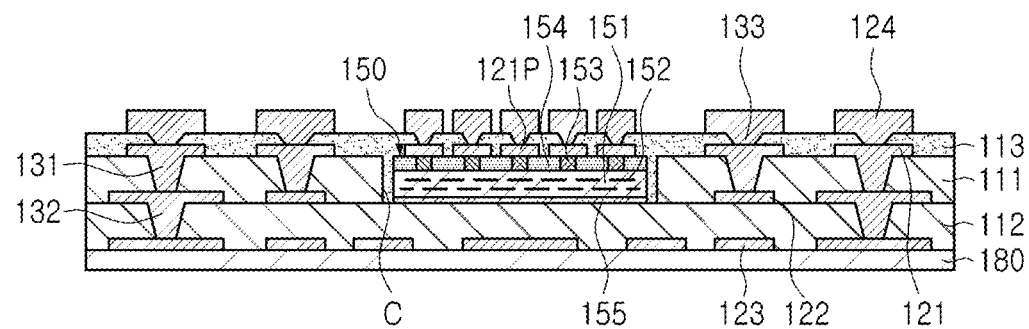

Referring to FIG. 15E, a fourth redistribution pattern 124 and a third via 133 may be formed. The fourth redistribution pattern 124 and the third via 133 may be formed using a circuit formation process such as AP, SAP, MSAP, or TT after processing the via hole in the third build-up insulating material 113.

The printed circuit board 100C according to another example may be manufactured through a series of processes. As necessary, a resist may be further formed on the third build-up insulating material 113, and a thinning process may be performed on the resist. Then, the manufactured printed circuit board 100C may be separated from the carrier substrate 180. For example, a carrier copper foil portion may be separated from the carrier substrate 180, and then a carrier copper foil may be removed by etching, but exemplary embodiments are not limited thereto.

Figure 16:
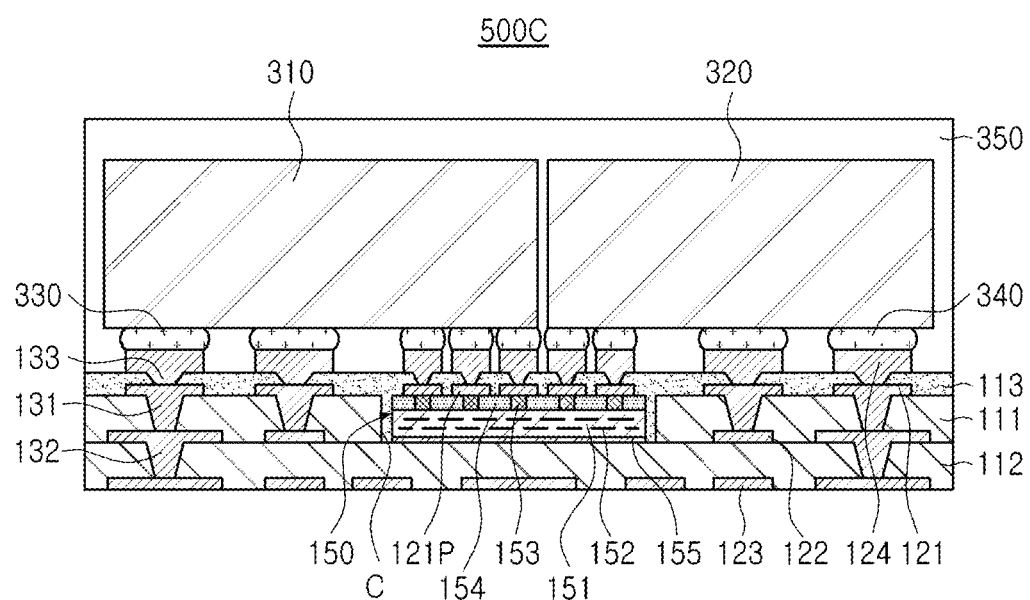
FIG. 16 is a schematic cross-sectional view illustrating another example of a semiconductor package.

FIG. 16 is a schematic cross-sectional view illustrating another example of a semiconductor package.

Referring to the drawing, a semiconductor package 500C according to another example may include a printed circuit board 100C according to another example and a plurality of semiconductor chips 310 and 320, respectively mounted on the printed circuit board 100C. The plurality of semiconductor chips 310 and 320 may be mounted on the printed circuit board 100C through a plurality of bumps 330 and 340, respectively. For example, the plurality of semiconductor chips 310 and 320 may be connected to the fourth redistribution pattern 124 through the plurality of bumps 330 and 340, respectively. Each of the plurality of semiconductor chips 310 and 320 may be covered with a molding material 350.

Other descriptions, for example, the descriptions provided in the above-described printed circuit board 100A according to an example, the above-described printed circuit board 100B according to another example, the above-described semiconductor package 500A according to an example, and the above-described semiconductor package 500B according to another example, which do not conflict with the following description, may be applied to the semiconductor package 500C, and thus, overlapping descriptions will be omitted.

As described above, a printed circuit board, capable of improving alignment when a bridge is embedded, and a semiconductor package including the printed circuit board may be provided.

In the present disclosure, "in a cross-section" may refer to a cross-sectional shape when an object is vertically taken, or a cross-sectional shape when the object is viewed from side. In addition, "in a plane" may refer to a shape when the object is horizontally taken, or a planar shape when the object is viewed from above or below.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not always refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than to limit the present disclosure. In this case, singular forms include plural forms unless necessarily interpreted otherwise, based on a particular context.

While exemplary embodiments have been shown and described above, it will be apparent to those skilled in the art that modifications and variations could be made without departing from the scope of the present disclosure as defined by the appended claims.

What is claimed is:

1. A printed circuit board comprising:
a bridge including a first insulating material, a wiring pattern disposed in the first insulating layer, a metal post disposed on the first insulating material and connected to the wiring pattern, and a second insulating material disposed on the first insulating material and covering at least a portion of the metal post;
a first build-up insulating material disposed around the bridge; and
a first redistribution pattern disposed on the second insulating material and the first build-up insulating material and including a metal pad connected to the metal post,
wherein
the second insulating material has transparency, higher than transparency of at least one of the first insulating material and the first build-up insulating material.

2. The printed circuit board of claim 1, wherein
an upper surface of the metal post is substantially coplanar with an upper surface of the second insulating material.

3. The printed circuit board of claim 1, wherein
at least a portion of the metal post protrudes upwardly of an upper surface of the second insulating material.

4. The printed circuit board of claim 3, wherein
the metal pad is disposed on the upper surface of the second insulating material to cover the at least protruding portion of the metal post.

5. The printed circuit board of claim 4, wherein
the metal pad includes a seed layer continuously disposed on the upper surface of the second insulating material, a side surface of the at least protruding portion of the metal post, and an upper surface of the at least protruding portion of the metal post.

6. The printed circuit board of claim 1, further comprising:
a second redistribution pattern disposed in the first build-up insulating material and connected to the first redistribution pattern through a first via.

7. The printed circuit board of claim 6, further comprising:
a second build-up insulating material disposed on a lower side of the first build-up insulating material; and a third redistribution pattern disposed in the second build-up insulating material and connected to the second redistribution pattern through a second via.

8. The printed circuit board of claim 7, wherein
the bridge is attached to an upper surface of the second build-up insulating material through an adhesive.

9. The printed circuit board of claim 1, further comprising:
a resist disposed on the bridge and the first build-up insulating material and covering at least a portion of the first redistribution pattern,
wherein
an upper surface of the first redistribution pattern and an upper surface of the resist have a step difference.

10. The printed circuit board of claim 9, wherein
the upper surface of the first redistribution pattern is disposed above the upper surface of the resist, and
the resist has a thickness, less than a thickness of the first redistribution pattern.

11. The printed circuit board of claim 1, further comprising:
a third build-up insulating material disposed on the bridge and the first build-up insulating material; and
a fourth redistribution pattern disposed on the third build-up insulating material and connected to the first redistribution pattern through a third via.

12. The printed circuit board of claim 1, wherein
an upper surface of the second insulating material protrudes upwardly of an upper surface of the first build-up insulating material.

13. The printed circuit board of claim 1, wherein
the first build-up insulating material is in contact with a side surface of the bridge.

14. The printed circuit board of claim 1, wherein
the first build-up insulating material is provided with a cavity in which the bridge is disposed.

15. The printed circuit board of claim 14, wherein
the first build-up insulating material is spaced apart from the bridge.

16. The printed circuit board of claim 1, wherein
each of the first and second insulating materials includes an organic insulating material.

17. A printed circuit board comprising:
a bridge including a first insulating material, a wiring pattern disposed in the first insulating layer, a metal post disposed on the first insulating material and connected to the wiring pattern, and a second insulating material disposed on the first insulating material and covering at least a portion of the metal post;
a first build-up insulating material covering at least a portion of the bridge; and
a first redistribution pattern disposed on the second insulating material and the first build-up insulating material and including a metal pad connected to the metal post, wherein
an upper surface of the first build-up insulating material is provided with a groove portion exposing at least a portion of the second insulating material around the bridge.

18. The printed circuit board of claim 17, wherein
an upper surface of the first build-up insulating material has a step difference at the groove portion.

19. The printed circuit board of claim 17, wherein
a wall surface of the groove portion has a tapered shape.

20. A printed circuit board comprising:
a bridge including a first insulating material, a wiring pattern disposed in the first insulating layer, a metal post disposed on the first insulating material and connected to the wiring pattern, and a second insulating material disposed on the first insulating material and covering at least a portion of the metal post;
a first build-up insulating material disposed around the bridge; and
a first redistribution pattern disposed on the second insulating material and the first build-up insulating material and including a metal pad connected to the metal post, wherein
the first redistribution pattern is in contact with the first build-up insulating material, and
among an upper surface and a side surface of the first insulating material, the second insulating material is disposed only on the first insulating material.

21. The printed circuit board of claim 20, wherein
an upper surface of the metal post is substantially coplanar with an upper surface of the second insulating material.

22. The printed circuit board of claim 20, wherein
at least a portion of the metal post protrudes upwardly of an upper surface of the second insulating material.

23. The printed circuit board of claim 20, further comprising:
a resist disposed on the bridge and the first build-up insulating material and covering at least a portion of the first redistribution pattern,
wherein
an upper surface of the first redistribution pattern and an upper surface of the resist have a step difference.

24. The printed circuit board of claim 20, further comprising:
a third build-up insulating material disposed on the bridge and the first build-up insulating material; and
a fourth redistribution pattern disposed on the third build-up insulating material, and connected to the first redistribution pattern through one via.

25. The printed circuit board of claim 20, wherein
the first build-up insulating material is in contact with a side surface of the bridge.

26. The printed circuit board of claim 20, wherein
the first build-up insulating material is provided with a cavity in which the bridge is disposed, and the first build-up insulating material is spaced apart from the bridge.

* * * * *